(12) United States Patent
Lee (10) Patent No.: US 11,437,833 B1
(45) Date of Patent: Sep. 6, 2022

(54) VERTICAL TOWER POWER DOCK

(71) Applicant: Yuyi Lee, La Palma, CA (US)

(72) Inventor: Yuyi Lee, La Palma, CA (US)

( * ) Notice: Subject to any disclaimer, the term of this patent is extended or adjusted under 35 U.S.C. 154(b) by 37 days.

(21) Appl. No.: 17/196,902

(22) Filed: Mar. 9, 2021

(51) Int. Cl.
| H05K 5/02 | (2006.01) |
| H02J 7/00 | (2006.01) |
| H05K 7/10 | (2006.01) |

(52) U.S. Cl.
CPC .......... *H02J 7/0044* (2013.01); *H05K 5/0204* (2013.01); *H05K 5/0247* (2013.01); *H05K 7/1053* (2013.01)

(58) Field of Classification Search
None
See application file for complete search history.

(56) References Cited

U.S. PATENT DOCUMENTS

| 6,113,198 | A * | 9/2000 | Hommes | A47F 3/001 |
| | | | | 211/26 |
| 7,189,107 | B1 * | 3/2007 | Strayer | H01R 13/6456 |
| | | | | 439/501 |
| 9,030,828 | B2 * | 5/2015 | Lindblad | G06F 1/1607 |
| | | | | 361/679.56 |
| 9,368,924 | B2 * | 6/2016 | Byrne | H01R 13/743 |
| 9,955,784 | B1 * | 5/2018 | Smith | H02J 7/0044 |
| 10,135,268 | B1 * | 11/2018 | Gokcebay | H05K 7/1449 |
| 10,432,001 | B1 * | 10/2019 | Bellis | A47B 47/02 |
| 2009/0157907 | A1 * | 6/2009 | Chapman | H02J 7/0013 |
| | | | | 710/8 |
| 2009/0267564 | A1 * | 10/2009 | Gerber | H02J 7/0013 |
| | | | | 320/114 |
| 2011/0204757 | A1 * | 8/2011 | Komata | A47B 81/00 |
| | | | | 312/204 |
| 2014/0062390 | A1 * | 3/2014 | Webber | H02J 7/0027 |
| | | | | 320/107 |
| 2018/0191113 | A1 * | 7/2018 | Byrne | H01R 25/003 |
| 2019/0289740 | A1 * | 9/2019 | Roberts | H02J 7/0044 |
| 2021/0194271 | A1 * | 6/2021 | Gharabegian | H02J 50/80 |

* cited by examiner

Primary Examiner — Xanthia C Cunningham
(74) Attorney, Agent, or Firm — John D. Tran; Rhema Law Group (57) ABSTRACT

Embodiments disclosed herein relate to a system for using a top port, middle port, and bottom port to charge mobile devices and use other laptops and devices at mobile workstations, and also store a power cord to provide power for the system. The system includes a first connecting port to charge mobile devices. The system also includes a second connecting port underneath the first connecting port, wherein the second connecting port is configured to receive a first cord with at least two connecting prongs. The system also includes a third connecting port configured below the first and second connecting port. The third connecting port is configured to receive a second cord with at least three connecting prongs. The system also includes a base configured to store a power cord to provide power to the system.

20 Claims, 6 Drawing Sheets

VERTICAL TOWER POWER DOCK

TECHNICAL FIELD

The present disclosure generally relates to a vertical tower power dock system. More specifically, the present invention provides a vertical tower power dock system for connecting to multiple ports through connecting cords and providing additional space around the vertical tower power dock system by storing the connecting cords within the base of a vertical tower power dock system.

BACKGROUND

Power outlets, which provide openings for connecting cords, can typically found in walls. As such, users will often have to find power outlets within walls that provide openings for either a single prong or multiple prongs. As such, in many instances, users may decide to find workstations that contain multiple ports to plug in with their connecting cords as opposed to power outlets that are configured within walls.

Nevertheless, an issue with workstations with multiple connecting ports is the multiple ports often cannot accommodate the preferences of the users. Many users would prefer to want to increase the height tower in which the ports are configured to. Further, other users may prefer to lower the tower so that each port within the tower can be accessed from a sitting position.

Another inconvenience with typical towers that provide multiple connecting ports is that the storage of the power cords that provide power to the workstation can be problematic. Users that finish using the power cord often will leave the power cord hanging without a place to store the power cord safely. In the alternative, users may manually wrap the power cord by hand without having an area to secure the power cord. There is no place in and around the workstation in which the power cord can be stored securely without taking up unnecessary space around the workstation.

Therefore, users can be greatly assisted by workstations in which multiple connecting ports are available for use, and where the workstation can be adjusted according to the preferences of the users. In addition, it would also be beneficial to users to be able to store the power cord safely and efficiently without leaving the power cord hanging on the exterior of the workstation tower, and taking up unnecessary space as a result.

SUMMARY

An embodiment relates to a system comprising: A tower configured in a vertical direction to provide openings for a series of connecting cords. A first connecting port configured in a vertical direction in a tower. The first connecting port is configured to charge one or more mobile devices. The system also includes a second connecting port configured in the vertical direction in the tower and directly underneath the first connecting port. The tower region around the second port provides support for the first connecting port and the second connecting port is configured to receive a first connecting cord with at least two connecting prongs. The system also includes a third connecting port configured below the first connecting port and the second connecting port in the tower. Another tower region around the third connecting port provides support for the first connecting port and the second connecting port. The third connecting port is configured to receive a second connecting cord with at least three connecting prongs. The system also includes a base configured to provide a power cord to provide power to the tower. The base also provides space to provide storage for power cord. The power cord is stored within an interior portion of the base to crease space around an exterior region of the base and exterior region of the tower.

The tower base includes a groove to store the power cord.

A height around the first connecting port is configured to be extended.

The power cord is to be wrapped around the base of the system.

Another embodiment relates to a system comprising: a series of ports configured in a vertical direction within a tower. A top port is configured to provide charging to one or more mobile devices. A middle port is configured to receive a first connecting cord with at least two prongs to connect the first connecting cord to the tower. A bottom port is configured to receive a second connecting cord with three or more prongs to connect to the tower. The system also includes a base station configured underneath the series of ports to provide structural support for the top port, middle port, and bottom port within the tower. The base station is configured to provide storage for a power cord configured to provide power to the system. The power cord is stored within an interior region of the base station and does not extend away from the base station. The power cord is stored within the base station to provide additional spacing in an exterior region around the base station and the tower.

A height of the tower is modified to enable the first connecting cord and the second connecting cord to be used at different heights.

A height of the tower is configured to increase to enable the top port to be used at a greater height.

An area for storing the power cord is constant when a height of the tower is increased.

A height of the tower is decreased to enable the middle port to receive the second connecting cord at a reduced height.

A method can include configuring a tower in a vertical direction to provide openings for a series of connecting cords. The method also includes configuring a first connecting port in a vertical direction to provide charging for one or more mobile devices. The method also includes positioning a second connecting port in the vertical direction in the tower and directly underneath the first connecting port. A tower region around the second connecting port provides support for the first connecting port, wherein the second connecting port is configured to receive a first connecting cord with at least two connecting prongs. The method also includes configuring a third connecting port below the first connecting port and the second connecting port in the tower. Another tower region around the third connecting port provides support for the first connecting port and the second connecting port, wherein the third connecting port is configured to receive a second connecting cord with three connecting prongs. The method also includes situating a base configured to receive a power cord that provides power to the tower. The base provides space to provide storage for the power cord. The power cord is also wrapped within the base. The power cord is stored within an interior portion of the base to provide additional space around an exterior region of the base and the tower.

The method includes elevating a height of the tower to enable use of the first connecting port, second connecting port, and third connecting port at a greater height.

A groove is positioned within the base to provide the storage for the power cord.

Other contemplated embodiments can include objects, features, aspects, and advantages in addition to or in place of those mentioned above. These objects, features, aspects, and advantages of the embodiments will become more apparent from the following detailed description, along with the accompanying drawings.

BRIEF DESCRIPTION OF THE FIGURES

The vertical tower power dock system in which like reference numerals are intended to refer to like components, and in which.

Unless otherwise indicated illustrations in the figures are not necessarily drawn to scale.

DETAILED DESCRIPTION OF SOME EMBODIMENTS

Background and Context

The disclosed embodiments are best understood by reference to the figures and detailed description herein.

Disclosed embodiments of the invention are discussed below with reference to the Figures. However, those skilled in the art will appreciate that the detailed description provided herein with respect to these figures is for explanatory purposes as the invention may extends beyond these currently disclosed embodiments. Various alternate approaches to implement the functionality of any given detail described herein are envisioned. That is, there are modifications and variations of the invention that are too numerous to be listed but that all fit within the scope of the invention. Also, singular words should be read as plural and vice-versa, where appropriate, and alternative embodiments do not imply mutual exclusivity.

It is to be further understood that the disclosed embodiments are not necessarily limited to the particular methodology, techniques, uses, and applications, described herein, as these may vary. It is also to be understood that the terminology used herein is used for the purpose of describing particular embodiments only, and is not otherwise intended to limit the scope of the present invention. It must be noted that as used herein in the detailed description and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Physical and/or conceptual structures described herein are to be understood also to refer to functional equivalents of such structures.

All words of approximation as used in the present disclosure and claims should be construed to mean "approximate," rather than "perfect". Words of approximation, include, yet are not limited to terms such as "substantial", "nearly", "almost", "about", "generally", "largely", etc.

Terms of degree are not necessarily indefinite. "Claim language employing terms of degree has long been found definite where it provided enough certainty to one of skill in the art when read in the context of the invention." *Interval Licensing LLC v. AOL. Inc.*, 766 F.3d 1364, 1370, 112 USPQ2d 1188, 1192-93 (Fed. Cir. 2014) (citing *Eibel Process Co. v. Minnesota & Ontario Paper Co.*, 261 U.S. 45, 65-66 (1923. Thus, when a term of degree is used in the claim, the examiner should determine whether the specification provides some standard for measuring that degree. *Hearing Components. Inc. v. Shure Inc.*, 600 F.3d 1357, 1367, 94 USPQ2d 1385, 1391 (Fed. Cir. 2010); *Enzo Biochem. Inc., v. Applera Corp.*, 599 F.3d 1325, 1332, 94 USPQ2d 1321, 1326 (Fed. Cir. 2010); *Seattle Box Co., Inc. v. Indus. Crating & Packing. Inc.*, 731 F.2d 818, 826, 221 USPQ 568, 574 (Fed. Cir. 1984).

The term "substantially" is often used in conjunction with another term to describe a particular characteristic of the claimed invention. It is a broad term. In re Nehrenberg, 280 F.2d 161, 126 USPQ 383 (CCPA 1960). The court held that the limitation "to substantially increase the efficiency of the compound as a copper extractant" was definite in view of the general guidelines contained in the specification. In re Mattison, 509 F.2d 563, 184 USPQ 484 (CCPA 1975).

All questions of enablement are evaluated against the claimed subject matter. The focus of the examination inquiry is whether everything within the scope of the claim is enabled.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although Claims have been included in this Application to specific enumerated combinations of features, it should be understood that the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc. v.*

*H.J. Heinz Co.*, 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function(s of the teachings related to any described embodiment of the present invention may be suitably changed by those skilled in the art.

Aspects of the present invention are described below with reference to flowchart illustrations and/or block diagrams of methods, and systems according to the disclosed embodiments. Each block of the flowchart illustrations and/or block diagrams, and combinations of blocks in the flowchart illustrations and/or block diagrams, can be implemented by various means.

The flowchart and block diagrams in the figures illustrate the architecture, functionality, and operation of possible implementations of systems and methods according to various embodiments. In this regard, each block in the flowchart or block diagrams may represent a segment which comprises one or more executable instructions for implementing the specified logical function(s). Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

Additionally, any uses of the phrase "configured to" or "operable for" can include generic structure that is manipulated to operate in a manner that is capable of performing the task(s) at issue.

Introduction

The present invention provides a vertical tower power dock system (power dock system) for providing ports for users to connect to at work stations. Users can use the power dock system in either a sitting or standing position. The power dock system includes a tower that consists of a top port, middle port, and bottom port. The top port can typically including an opening to charge mobile devices. The middle port includes an opening for a connector which has up to two connecting prongs. The bottom port can include an opening for a connector that has up to three prongs.

The power dock system can also include base or base station at the bottom of power dock system. A power cord can extend from the base of the power dock system. Mobile devices can be wirelessly charged to the top port. A connecting cord with at least two connecting prongs can connecting to the middle port that is configured beneath the top port within the tower. Further, the third connecting cord with at least three connecting prongs can connect to the bottom port configured underneath the top port and middle port.

Users can charge the tower using the power cord. After users have finished charging the tower, the power cord can be stored within the base of the tower. Within the base is a cavity. As such, the power cord can be stored within the cavity region. Due to the storage of the power cord within the base, additional space is available around the exterior region of the tower and the base. The power cord does not need to be stored on the outside regions of either the tower and base, and therefore take unnecessary space around the power dock system. Accordingly, the power cord is stored neatly and efficiently within the base of the tower, and thereby saves additional space around the exterior regions of the base and the tower.

In an embodiment, the height of the tower can be increased to enable users to be able to use the top port, middle port, and bottom port in a standing position. Users may want to be able to access each port while working at a standing station that can be found in places such as airports. As such, the height of the tower can be increased to accommodate users who prefer to use the top port, middle port, and bottom port in the standing position.

In another embodiment, the height of the tower can also be reduced to enable users to access the top port, middle port, and bottom port in sitting positions. Users that prefer to use the power dock system in a sitting position can reduce the height of the tower. When the height of the tower is reduced, each port can be used by users while the users are in a sitting position at a desk or table.

System Structure

Figure 1:
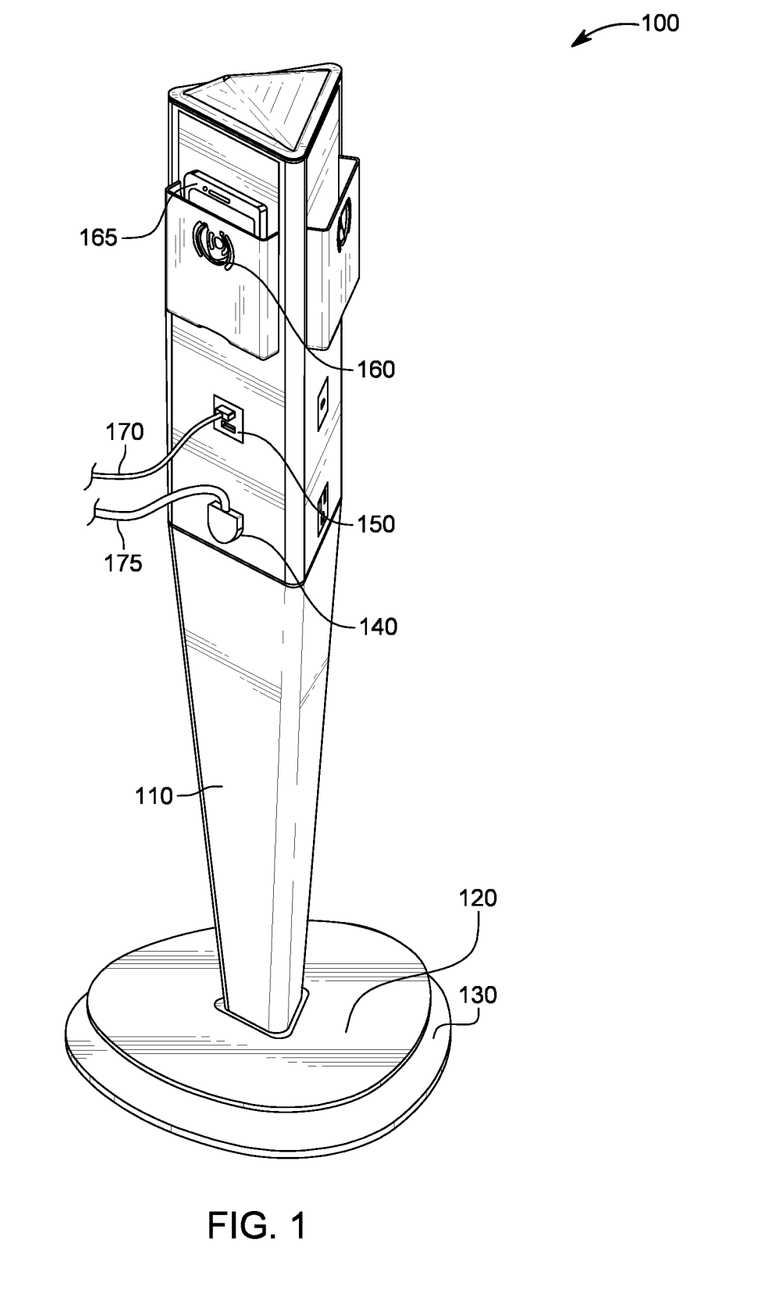
FIG. 1 illustrates an exemplary diagram of a vertical tower power dock system in accordance with an embodiment of the presently disclosed embodiments.

FIG. 1 illustrates an embodiment of a vertical tower power dock system (power dock system) 100. The power dock system 100 can be used by users to place cords into multiple ports within the power dock system 100. Users may use the power dock system 100 while either sitting at a table or while standing. Multiple users can use the power dock system 100 simultaneously.

In FIG. 1, the power dock system 100 includes a tower 110 and a base 120. At the top of the tower 110 is a top port 160. The top port 160 can be configured to provide charging for a mobile device 165. The top port 160 can typically be used by users while standing at a workstation found at a coffee shop or airport. However, in other embodiments, the height of the tower 110 can be reduced to enable users to use the top port 160 at a reduced height, such as if a user is sitting at a table and the top port 160 needs to be lowered to enable the user to use the top port 160 at the table. Underneath the top port is the middle port 150. The middle port 150 can have an opening for a cord that has two prongs or two connectors. As such, the cord 170 can be used to connect to the middle port 150. A user can decide to use the middle port 170 should the user have cord that has two prongs. The user can decide to use the middle port 150 at either at increase height, reduced height, or a standard height. The user can set the preference of height for the middle port 150 based on the preference to use the middle port 150 while standing or sitting down.

In reference to FIG. 1, a bottom port 140 is illustrated. The bottom port 140 can provide an opening for a cord that has up to three connecting prongs. The bottom port 140 can typically be used by a user in a sitting position. However, the user can also choose to raise the height of the tower 110 to use the bottom port 140 at a greater height. The cord 175 with three connecting prongs can be used to connect to the bottom port 140.

Referring to FIG. 1, within the base 120 of the power dock system 100 is a cavity region (cavity) 130. The cavity 130 can include a groove to store a power cord used to provide power to the power dock system 100. The cavity 130 also provides extra space around the tower 110 and the base 120 because the power cord will not be hanging outside of the tower 110 and the base 120 and take up extra space around the power dock system 100.

Figure 2:
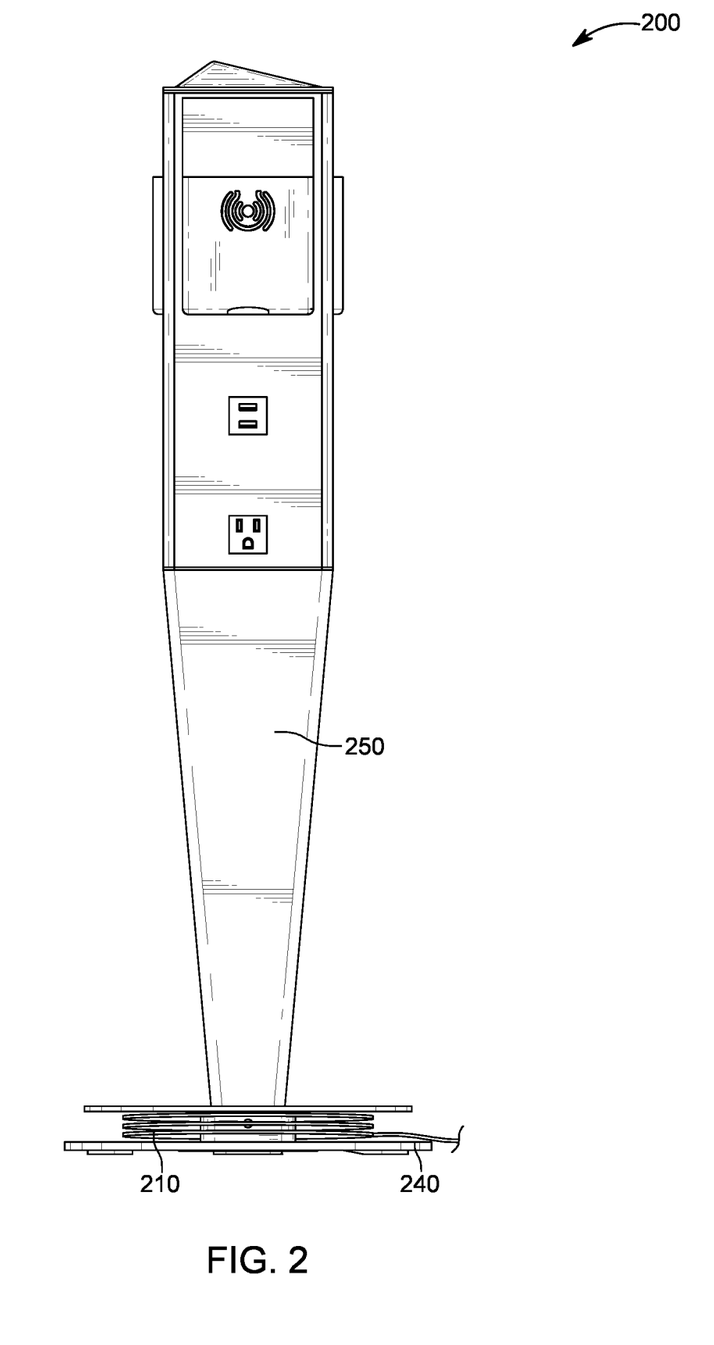
FIG. 2 illustrates another exemplary diagram of a vertical tower power dock system in accordance with the present invention.

Referring to FIG. 2, a top port, middle port, and a bottom port of the power dock system 200 are shown. A tower 250 for the ports is also shown. Underneath the tower 250 is the base 240. Within a cavity of the base is a power cord 210 that is used to provide power to the power dock system 200. The power cord 210 can be plugged within a wall outlet or power station to provide power to the power dock system 200. The cavity within base 240 enables space in and around the base 240 and the tower 250 to be saved. Space is saved because the power cord 240 is not hanging outside the base 240 or the tower 250 and taking up extra space as a result. The power cord 240 does not need to be in contact with the exterior of the base 240 or the tower 250. Within the cavity, the power cord 210 is wrapped within the cavity for safe and efficient storage.

In FIG. 2, with the storage method of the power cord 210, the space on the exterior of the base 240 and in the area adjacent to the base 240 is saved due to the cavity storing the power cord 210. Further, the user can also unwind the power cord 240 from the cavity within the base 240 if the user decides or prefers to charge the power dock system 200 while using the top port, middle port, and bottom port.

In other embodiments, the height of the tower described in FIGS. 1 and 2 can be reduced to accommodate users needing to sit while using the power dock system 100, 200. Users that need to perform work while working at a desk and table without standing will need the tower height to be reduced to be able to access the top port, middle port, and bottom port while in a sitting position at a table or desk. Nevertheless, in other embodiments, the height of the power dock system can be increased to accommodate multiple users using the power dock system at standing workstations such as at airports or business centers.

Figure 3:
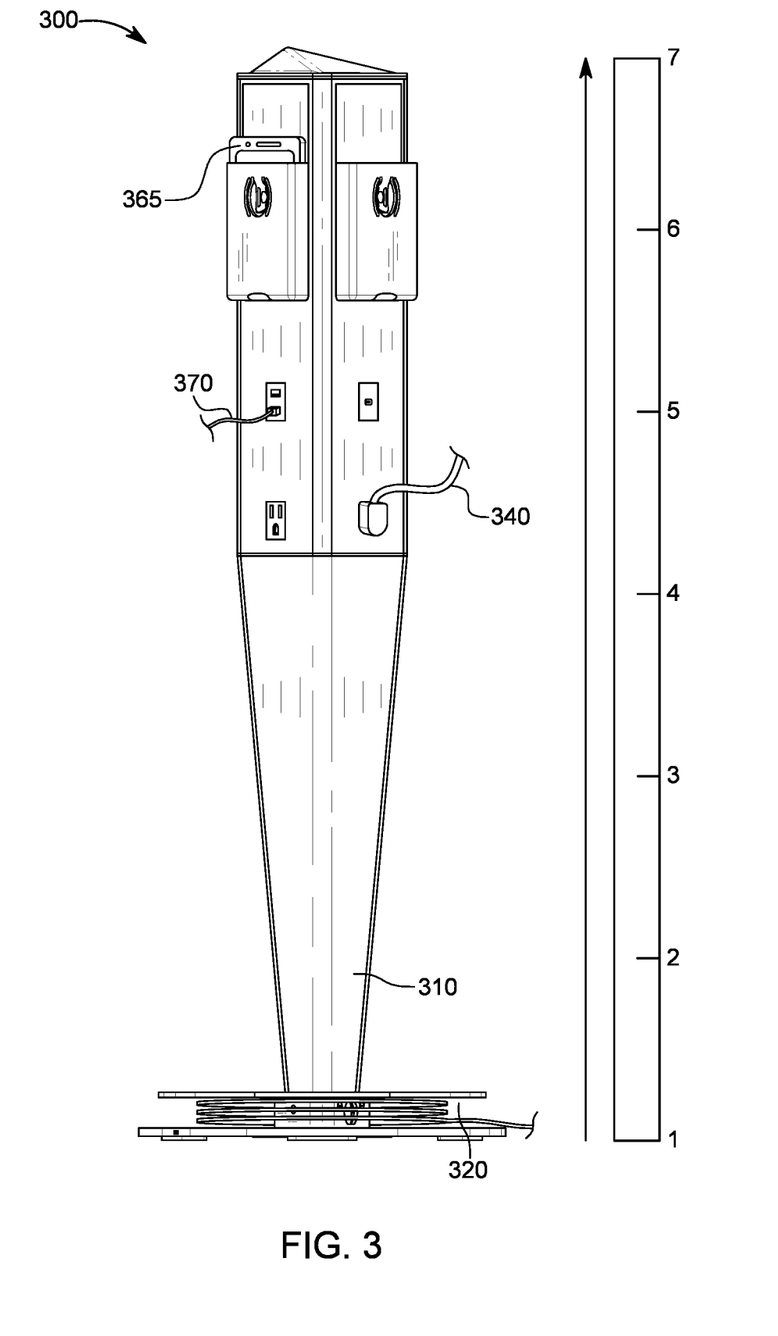
FIG. 3 illustrates a diagram of the vertical tower power dock system at an increased height in accordance with an embodiment of the presently disclosed embodiments.

Referring to FIG. 3, a power dock system 300 with a an increased height is illustrated. The height of the power dock system 300 can be increased if users prefer to use the power dock system 300 in a standing position at places such as airport workstations. As such, to accommodate multiple standing users, the height of the power dock system 300 can be increased. The power dock system 300 includes the tower 310 and the base 320. As such, users who need to stand and perform work at venues such as airports or communal work stations need to be be able to increase the height of the tower 310. The cavity space within the base 320 can remain the same as the height of the tower 310 is increased. The users, given the various height of one or more users, can adjust the height of the tower 310 to ensure that all of the users can use either top port, middle port, and bottom port. In addition, given the top port, middle port, and bottom port are on multiple sides of the power dock system 300, multiple users at the airport or communal work stations can make use of the multiple top ports, middle ports, and bottom ports to perform various tasks. Users can access the ports using a mobile device 365 and connecting cords 340, and 370.

In FIG. 3, the increased height of the power dock system 300 can also enable the bottom port to be used by a user in a sitting position while other users can use the top port and the middle port while standing. At communal and/or airport workstations, the increased height of the tower 310 will enable the lowest port to be used on each side of the tower 310 with the user being able to use the bottom port in a sitting position that can be at or near the eye level of the user as opposed to the user having to kneel down to reach the bottom port with connecting cord 340. For instance, at a normal height of the tower 310, the user may have to bend down to connect the bottom port with connecting cord 340. Therefore, raising the height of the tower 310 can enable the bottom port of tower 310 to be used without the user having to kneel down or go into an uncomfortable position to use the bottom port.

Figure 4:
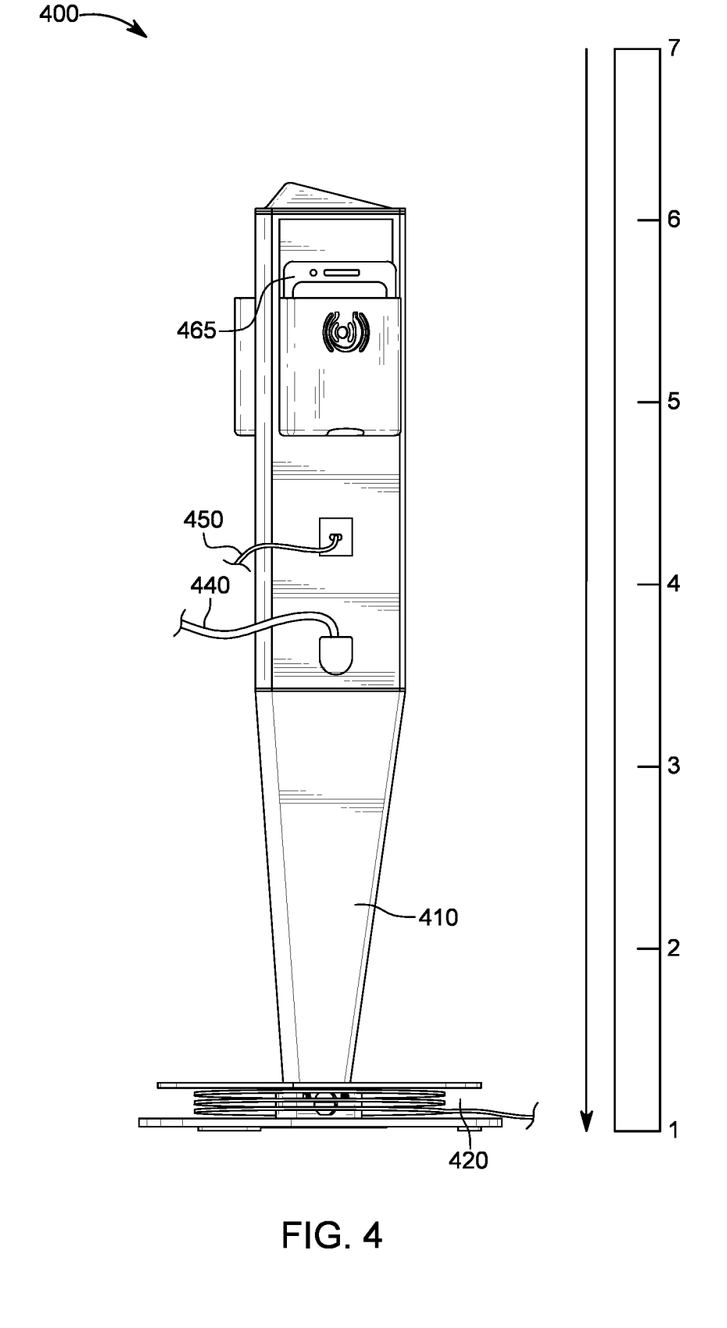
FIG. 4 illustrates a diagram of the vertical tower power dock system at a reduced height in accordance with an embodiment of the presently disclosed embodiments.

Referring to FIG. 4, a power dock system 400 is illustrated at a reduced height. Users of the power dock system 400 may need to work with their mobile and computing devices in a sitting position. To accommodate the users needed to work in a sitting position, the height of the power dock system 400 can be reduced.

FIG. 4 illustrates the tower 410 at a reduced height. At the reduced height, the ports (top, middle, and bottom) can be accessed at a sitting position. The users can use a mobile device 465, and cords 440, and 450, wherein the mobile device 465, and cords 450, and 440 can be used to access the top port, middle port, and bottom port respectively. A power cord can be used to provide power to the power dock system 400. In addition, the power cord can be stored within a cavity 420 within a base of the power dock system 400. In storage, power cord can be wrapped within the cavity 420 of the base. Storing the power cord within the cavity 420 can save additional space around the tower 410 and the base region. The reduced height of the tower 410 can enable use of each of the ports to multiple users at work tables or desks. Moreover, if necessary, to accommodate specific users, the height of the tower 410 can be further reduced so that the mobile device 465, and cords 440, 450 can more readily access the respective ports.

Referring to FIG. 4, the height of the tower 410 can be reduced when necessary to enable multiple users to use the top port, middle port, and bottom port. In addition, even at the reduced height of the tower 410, the power cord can still be securely stored within the cavity 420. At the reduced height for the tower 410, the cavity 420 can still enable space to be provided around the tower 410 and the base region of the power dock system 400.

Figure 5:
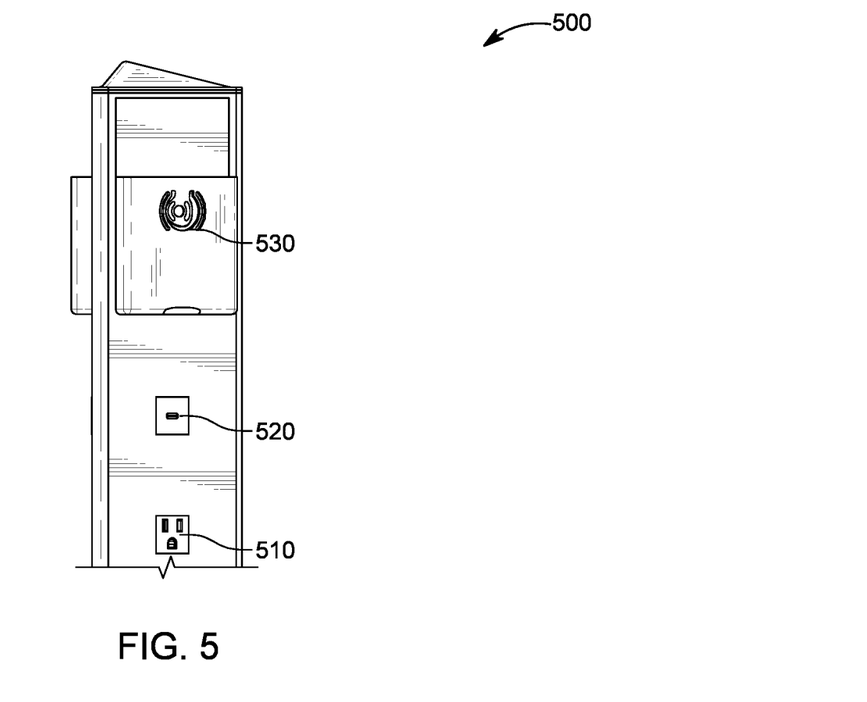
FIG. 5 illustrates an exploded view of the tower in accordance with an embodiment of the invention.

In FIG. 5, more detailed look at the ports 510, 520, 530 of a power dock system 500 is illustrated. The top port 530 can typically be used either in a standing or sitting position at airport workstations or at tables typically found in offices. A mobile device can be charged at the top port in which a user is enabled to use the top port while standing, or while sitting down when the power dock system 500 is at a reduced height. Users can use the middle port 520 also in a standing position when the height of the power dock system 500 is increased. In addition, if users need to work in a sitting position, the height of the power dock system 500 can be reduced to allow the users to use the middle port 520 while sitting down. The bottom port 510 may typically be used when users are in a sitting position. Nevertheless, the height of the power dock system 500 can be raised when needed to enable users to use the bottom port 510 at a standing position.

Referring to FIG. 5, the top portion of the power dock system 500 shows how a mobile device and different cords can be used to connect to the ports. A cord with three connecting prongs can be used to connect to the bottom port 510. A cord with more than one connecting prong can be used to connect to the middle port 520, while a mobile device can be used for charging at the top port 530. As such, while raised to a greater height or lowered to a lesser height, the power dock system 500 provides connections to various cords and enables charging of mobile devices for a multitude of users in a standing or sitting position.

Figure 6:
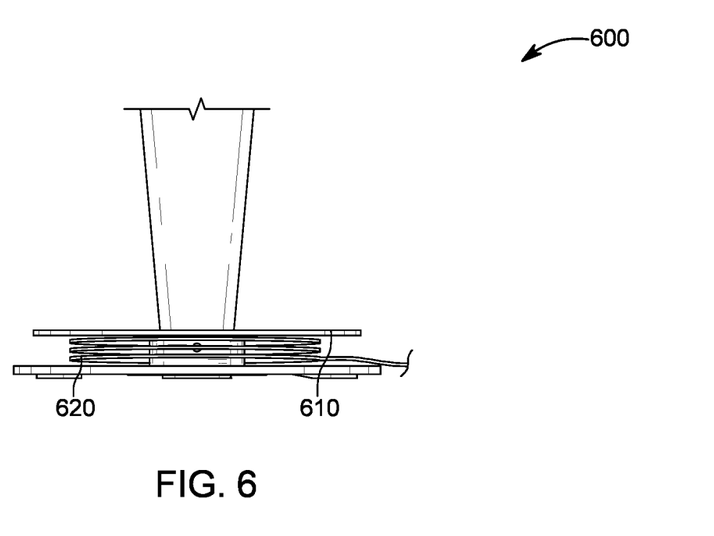
FIG. 6 illustrates an exploded view of the base in accordance with an embodiment of the invention.

In FIG. 6, an another expanded view of a power dock system 600 is illustrated. In particular, a depiction of a power cord 620 stored within a cavity of a base 610 of the power dock system 600 is illustrated. The power cord 620 can be stored within the cavity of the base 610 to save space around the base 610 and the tower of the power dock system 600. The storage of the power cord 620 in the cavity region of the base 610 enables for additional space around the base 610 and the tower of the power dock system 600. The power cord 620 does not need to be stored outside of the base 610 and in contact with the tower, which would take up unnecessary space around the base 610 and the tower. Moreover, the power cord 620 does not have to be positioned outside of the base 610 and hanging on exterior portions of either the base 610 or the tower. The cavity region within the base 610 therefore provides efficient storage of the power cord 620 and allows for additional space around the base 610 and the tower of the power dock system 600.

Figure 7:
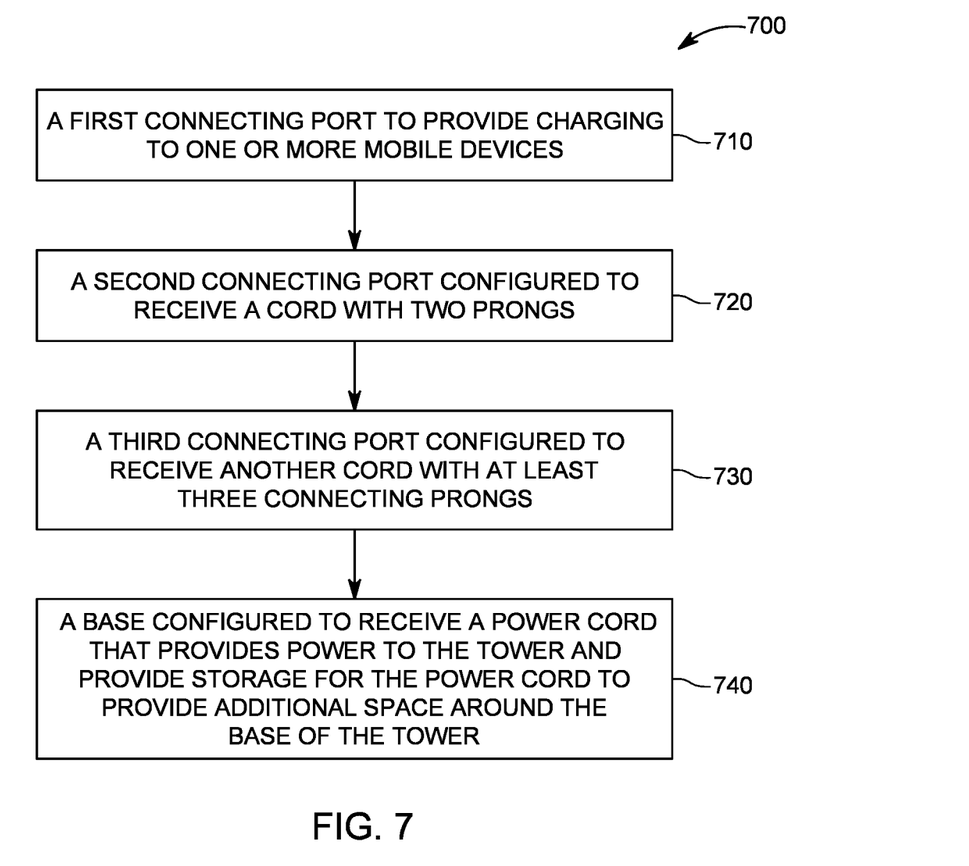
FIG. 7 illustrates a flowchart describing a method and use of the vertical tower power dock system in accordance with an embodiment of the invention.

FIG. 7 illustrates a method and process for using the power dock system for providing multiple ports to be used by users at workstations and tables. The top port, middle port, and bottom port can be used by a variety of computational devices. The cavity within the base of the power dock system can provide storage for a power cord that provides power to the power dock system. In addition, the height of the power dock system can be adjusted to enable users to use the power dock system at different heights and work from either a standing or sitting position.

In FIG. 7, at step 710, a first connecting port is configured to charge one or more mobile devices. The first connecting port is the top port in the power dock system. The top port can provide safe and efficient access to charge one or more mobile devices.

In FIG. 7, at step 720, a second connecting port is configured to receive a cord with two or more connecting prongs. The second connecting port is the middle port that is configured below the top port. The tower region for the second connecting port provides structural support for the tower region of the first connecting port. Users can use a connecting cord with two or more prongs to connect to the second connecting port or middle port in the power dock system.

In FIG. 7, at step 730, a third connecting port is configured to receive a cord with up to three connecting prongs. The third connecting port is the bottom port configured underneath the top port and middle port in the power dock system. Connecting cords with three prongs can be used to connect to the third connecting port in the power dock system. The tower region of the third connecting port provides structural support for the tower regions of the first and second connecting ports.

In FIG. 7, at step 740, a base at the bottom of the power dock system is configured to provide a power cord used to provide power to the power dock system. The power dock can be plugged into a wall outlet or power station to provide power to the power dock system. The base is also configured with a cavity region, and a groove within the cavity region. The power cord can be stored within the cavity region and around the groove when the power cord is not in use. The base is configured to receive the power cord for storage to enable additional space to be available around the base and the tower of the power dock system. With the power cord within a cavity region of the base, the base and the tower are free from the power cord hanging on the outside of either the base and tower, and taking up unnecessary space as a result.

Those skilled in the art will appreciate that the example embodiments are non-exhaustive and that embodiments other than that described here may be included without departing from the scope and spirit of the presently disclosed embodiments.

Advantages

Disclosed embodiments relate to methods and systems for more charging mobile devices at a top port, and connecting cords to a middle port and bottom port in a power dock system. The methods and systems also relate to storing a power cord that provides power to the power dock system within a cavity region located within a base of the power dock system.

An advantage of the power dock system is that multiple users can use the top port, middle port, and bottom port for a variety of computation-related or other tasks that can be done on computational devices. Further, users can connect to each of the ports in either a standing or siting position.

Yet another advantage of the power dock system is that the height of the tower within the power dock system can be increased. Users at standing stations that can be found in office buildings and at airports can decide to raise the height of the power dock system. When the height of the power dock system is raised, the users can use each side of the power dock system that has the top port, middle port and bottom port in the standing position. The cavity region within the base of the power dock system can enable the power cord to be safely stored and leave space around the tower and the base of the power dock system.

An additional advantage is that the height of the power dock system can be reduced. Users can use the top port, middle port, and bottom port in a sitting position. The height of the tower of the power dock system can be further reduced to accommodate any user preferences.

Accordingly, the present invention seamlessly and efficiently operates a power dock system that enables users to use the power dock system at a normal height, and also at an increased and decreased height depending on user preference. Further, the power dock system enables users to safely and securely store the power cord for the power dock system within the base of the power dock system.

Conclusion

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the power dock system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

What is claimed is:

1. A system comprising:
    a tower positioned in a vertical direction to provide openings for a series of connecting cords;
    a first connecting port configured in a vertical direction in a tower, wherein the first connecting port is configured to charge one or more mobile devices;
    a second connecting port configured in the vertical direction in the tower and directly underneath the first connecting port, wherein a region of the tower around the second connecting port provides support for the first connecting port and the second connecting port and is configured to receive a connecting cord with at least two connecting prongs;
    a third connecting port configured below the first connecting port and the second connecting port in the tower, wherein another region of the tower around the third connecting port provides support for the first connecting port and the second connecting port, wherein the third connecting port is configured to receive a third connecting cord with at least three connecting prongs; and
    a base configured to provide structural support for the tower, the first connecting port, the second connecting port, and the third connecting port, wherein the base is configured provide a power cord to provide power to the tower, wherein the base provides space to provide storage for the power cord, and wherein the power cord is stored within the base to create space around an exterior region of the base and an exterior region of the tower.

2. The system of claim 1, wherein the base includes a groove to store the power cord.

3. The system of claim 1, wherein a height around the first connecting port is configured to be extended.

4. The system of claim 1, wherein the power cord is configured to be wrapped for storage in a cavity region within the base.

5. The system of claim 1, wherein an exterior portion for the base is not in contact with the power cord.

6. The system of claim 1, the base is configured at a bottom portion of the tower to store the power cord when the power cord is not charging the tower.

7. The system of claim 1, wherein a height of the tower is configured to be reduced.

8. A system comprising:
    a series of ports configured in a vertical direction within a tower, wherein a top port is configured to charge one or more mobile devices, wherein a middle port is configured to receive a first connecting cord with at least two prongs to connect the first connecting cord to the tower, and bottom port configured to receive a second connecting cord with three or more prongs to connect to the tower; and
    a base station configured underneath the series of ports to provide structural support for the top port, middle port, and bottom port within the tower, wherein the base station is configured to provide storage for a power cord, wherein the power cord is used to provide power to the tower that is configured with the series of ports, wherein the power cord is stored within the base station when not in use, and wherein the power cord is stored within the base station to provide additional spacing in an exterior region around the base station and the tower.

9. The system of claim 8, wherein a height of the tower is modified to enable the first connecting cord and second connecting cord to be used at one or more heights.

10. The system of claim 8, wherein a height of the tower is configured to increase to enable the top port to be used at a greater height.

11. The system of claim 8, wherein a cavity area for storing the power cord enables the additional spacing around the exterior region of the base station to increase.

12. The system of claim 8, wherein a storage area for the power cord is constant within the base station when a height of the tower is increased.

13. The system of claim 8, wherein a height of the tower is decreased to enable the middle port to receive the first connecting cord at a reduced height.

14. The system of claim 8, wherein a height of the tower is increased to provide additional space around the tower.

15. A method comprising:
    configuring a tower in a vertical direction to provide openings for a series of connecting cords;
    configuring a first connecting port in the vertical direction in the tower to provide charging for one or more mobile devices;
    positioning a second connecting port in the vertical direction in the tower and directly underneath the first connecting port, wherein a tower region around the second connecting port provides support for the first connecting port and the second connecting port is configured to receive a first connecting cord with at least two connecting prongs;
    configuring a third connecting port below the first connecting port and the second connecting port in the tower, wherein another tower region around the third connecting port provides support for the first connecting port and the second connecting port and the third connecting port is configured to receive a second connecting cord with three connecting prongs; and
    situating a base configured to provide structural support for the tower, the first connecting port, the second connecting port, and the third connecting port, wherein the base is configured to provide a power cord to provide power to the tower, wherein the base provides space to provide storage for the power cord, and wherein the power cord is stored within the base to create space around an exterior region of the base and an exterior region of the tower.

16. The method of claim 15, further comprising:
    elevating a height of the tower to enable use of the first connecting port, second connecting port, and third connecting port at a greater height.

17. The method of claim 15, wherein the power cord is wrapped in one or more configurations within the base to provide the spacing in an area surrounding the base of the tower.

18. The method of claim 15, wherein a groove is positioned within the base to enable the base to provide storage for the power cord.

19. The method of claim 15, further comprising:
   configuring a groove to enable the power cord to be wrapped in one or more alignments within the base of the tower.

20. The method of claim 15, further comprising:
   providing power to the tower while the first connecting port, second connecting port, and third connecting port are in use.

* * * * *